US012754221B2

(12) United States Patent
Lanniel et al.

(10) Patent No.: US 12,754,221 B2
(45) Date of Patent: Oct. 6, 2026

(54) CIRCUIT FOR OPERATING A CAPACITIVE SENSOR AND SENSOR APPARATUS

(71) Applicant: Robert Bosch GmbH, Stuttgart (DE)

(72) Inventors: Alice Lanniel, Pliezhausen (DE); Tobias Maier, Stuttgart (DE); Yunan Fu, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 166 days.

(21) Appl. No.: 18/918,159

(22) Filed: Oct. 17, 2024

(65) Prior Publication Data

US 2025/0130260 A1 Apr. 24, 2025

(30) Foreign Application Priority Data

Oct. 23, 2023 (DE) .................... 10 2023 210 418.0

(51) Int. Cl.
*G01R 27/26* (2006.01)
*B81B 7/02* (2006.01)
(Continued)

(52) U.S. Cl.
CPC ............ *G01R 27/2605* (2013.01); *B81B 7/02* (2013.01); *G01C 19/60* (2013.01); *G01D 5/24* (2013.01);
(Continued)

(58) Field of Classification Search
CPC ....... G01R 27/2605; B81B 7/008; B81B 7/02; B81B 2201/0235; B81B 2201/0242;
(Continued)

(56) References Cited

U.S. PATENT DOCUMENTS

2012/0062244 A1* 3/2012 Santana .................... G01L 9/12
324/658
2018/0254779 A1* 9/2018 Omran ................ H03M 1/1009
(Continued)

FOREIGN PATENT DOCUMENTS

DE 102020203036 A1 9/2021
DE 102022206600 A1 1/2024

OTHER PUBLICATIONS

Petkov et al., "A Fully Differential Charge-Balanced Accelerometer for Electronic Stability Control," IEEE International Solid-State Circuits, vol. 49, No. 1, 2014, pp. 262-270.

*Primary Examiner* — Thang X Le
(74) *Attorney, Agent, or Firm* — Norton Rose Fulbright US LLP

(57) ABSTRACT

A circuit for operating a capacitive sensor which can be operated in first to third modes. A GM stage receives a sensor voltage applied to a sensor output of the capacitive sensor and outputs a current. An integrator integrates the current over a time course and outputs an output voltage resulting therefrom. The circuit provides the output voltage to an analog-to-digital converter. In the first and second modes, the output voltage is provided to the capacitive sensor as a feedback voltage. In the first mode, an offset correction is further performed in the GM stage and the integrator. In the second mode, the sensor output of the capacitive sensor is switched to high impedance. In the third mode, a reference voltage is provided to the capacitive sensor.

12 Claims, 3 Drawing Sheets

(51) Int. Cl.
*G01C 19/60* (2006.01)
*G01D 5/24* (2006.01)
*G01P 15/125* (2006.01)

(52) U.S. Cl.
CPC .... *G01P 15/125* (2013.01); *B81B 2201/0235* (2013.01); *B81B 2201/0242* (2013.01)

(58) Field of Classification Search
CPC ...... G01C 19/60; G01C 19/5776; G01D 5/24; G01P 15/125
See application file for complete search history.

(56) References Cited

U.S. PATENT DOCUMENTS

2022/0004273 A1* 1/2022 Yu ........................... G06F 3/044
2023/0100447 A1* 3/2023 Lanniel .................... G01D 5/24
324/686

* cited by examiner

CIRCUIT FOR OPERATING A CAPACITIVE SENSOR AND SENSOR APPARATUS

CROSS REFERENCE

The present application claims the benefit under 35 U.S.C. § 119 of German Patent Application No. DE 10 2023 210 418.0 filed on Oct. 23, 2023, which is expressly incorporated herein by reference in its entirety.

FIELD

The present invention relates to a circuit for operating a capacitive sensor and to a sensor apparatus.

BACKGROUND INFORMATION

Capacitive sensors can be read using appropriate readout circuits. Petkov et al., "A fully differential charge-balanced accelerometer for electronic stability control", IEEE Journal of Solid-State Circuits, Vol. 49, No. 1, pp. 262-270, 2014 concerns a charge-balanced concept, wherein a voltage applied to both sides of the capacitive bridge of the sensor is provided by a negative feedback loop. The front end comprises an integrator for high gain, two summing amplifiers to provide voltage feedback to the sensor, and a sigma-delta modulator to digitize the signal into a bit stream that is processed by a back-end circuit. Chopping reduces electromagnetic interference (EMI) by distributing the interference across the entire sampling frequency bandwidth. However, interference at the chopping frequency can be sampled back to DC and therefore have an impact in the baseband.

German Patent Application NO. DE 10 2020 203 036 A1 describes a circuit for operating a capacitive sensor, wherein a boxcar sampling principle is used to reduce noise and EMI loading.

SUMMARY

The present invention provides a circuit for operating a capacitive sensor and a sensor apparatus.

Preferred embodiments of the present invention are disclosed herein.

According to a first aspect, the present invention relates to a circuit for operating a capacitive sensor that is configured to be operated alternately over a first time interval in a first mode, over a second time interval in a second mode and over a third time interval in a third mode. According to an example embodiment of the present invention, the circuit has a GM stage that receives a sensor voltage applied to a sensor output of the capacitive sensor and outputs an electrical current. An integrator integrates the current over a time course and outputs an output voltage resulting therefrom. The circuit provides the output voltage to an analog-to-digital converter. In the first and second modes, the output voltage is provided to the capacitive sensor as a feedback voltage. In the first mode, an offset correction is further performed in the GM stage and the integrator. In the second mode, the sensor output of the capacitive sensor is switched to high impedance. In the third mode, a reference voltage is provided to the capacitive sensor.

According to a second aspect, the present invention relates to a sensor apparatus having a capacitive sensor and to a circuit for operating the capacitive sensor according to the first aspect.

The present invention relates to a circuit for operating a capacitive sensor with improved electromagnetic compatibility (EMC) and noise performance. This reduces not only the alternating current effects of electromagnetic interference but also the direct current effects. The circuit uses a double integration method to significantly reduce both the DC effects of EMI and the noise contribution of the circuit.

According to an example embodiment of the present invention, the circuit provides the output voltage to the capacitive sensor as a feedback voltage in both the first time interval and the second time interval. The reference voltage is only provided to the capacitive sensor in the third time interval. As a result, an EMI-induced DC error is coupled into the second time interval and remains in the third time interval. Therefore, this error is integrated positively in the second time interval and negatively in the third time interval and is thereby compensated for.

The EMC performance can be significantly improved and the noise contribution of the circuit can be reduced. The use of double integration to reduce the EMI effects and noise contribution of the circuit can be applied in various types of readout circuits.

The first time interval is used to compensate for an offset and also to precharge the sensor.

According to a further development of the circuit of the present invention, the second time interval and the third time interval have the same length. The EMI-induced DC error is integrated positively in the second time interval and negatively in the third time interval. If the time interval is the same length, the error is compensated for.

According to a further development of the present invention, the circuit comprises a hold circuit that is designed to tap the output voltage of the integrator and to hold it as a hold voltage at an output of the hold circuit. For example, the hold circuit can have a ping-pong architecture, although other architectures are also possible.

According to a further development of the circuit of the present invention, the GM stage, the integrator and the hold stage are differential circuits.

According to a further development of the circuit of the present invention, the integrator is designed to integrate an EMI-induced DC error during the second time interval and during the third time interval with opposite signs. As a result, the error can be compensated for.

The integration can be carried out in the integrator either in continuous time or in discrete time. The present invention is not limited to a particular integration. The integration can be carried out in particular with different architectures.

According to a further development of the circuit of the present invention, the integrator is designed to integrate over a time course of a charge state of at least one capacitance of the integrator, which capacitance is charged by a sensor current of the GM stage. In particular, a DC error can be compensated for.

According to a further development of the circuit of the present invention, the hold circuit is coupled to the capacitive sensor via a plurality of feedback switches. The feedback signal can be provided via the feedback switches.

According to a further development of the circuit of the present invention, the sensor output of the capacitive sensor is coupled to the GM stage via a common mode capacitance.

According to a further development of the circuit of the present invention, the capacitive sensor is a MEMS sensor. The MEMS sensor can in particular be an acceleration sensor or a gyroscope.

According to a further development of the circuit of the present invention, the integrator is designed to integrate the output current continuously over time during one of the time intervals and to integrate it discretely between two cycles of time intervals.

According to a further development of the sensor apparatus of the present invention, the sensor output of the capacitive sensor is a common mode electrode of the capacitive sensor.

According to a further development of the present invention, the sensor apparatus is a charge-balanced sensor apparatus. However, other architectures are also possible, i.e. the sensor apparatus does not have to be a charge-balanced sensor apparatus.

Further advantages, features and details of the present invention will become apparent from the following description, in which various exemplary embodiments are described in detail with reference to the figures.

BRIEF DESCRIPTION OF THE DRAWINGS

In all figures, identical or functionally identical elements and devices are provided with the same reference signs.

DETAILED DESCRIPTION OF EXAMPLE EMBODIMENTS

Figure 1:
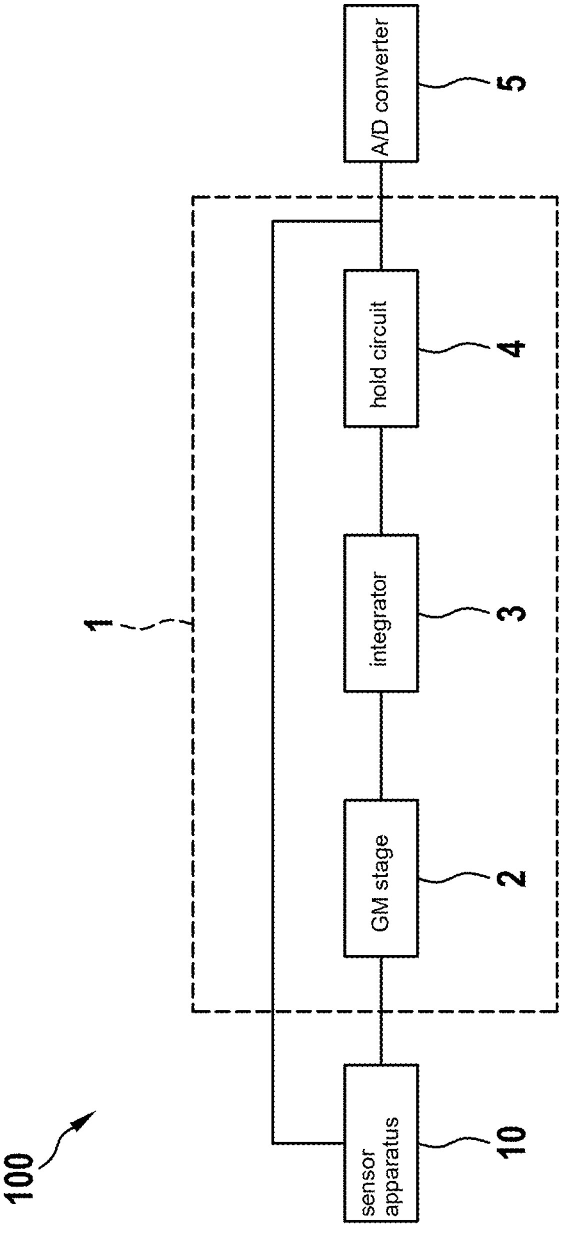
FIG. 1 shows a schematic block diagram of a sensor apparatus according to one example embodiment of the present invention.

FIG. 1 shows a schematic block diagram of a sensor apparatus 100 with a circuit 1 for operating a capacitive sensor 10. The capacitive sensor 10 is a MEMS sensor, in particular an acceleration sensor or a MEMS gyroscope.

The sensor 10 has an input side and an output side, wherein the output side is coupled to a GM stage 2. This converts an output signal, in this case a sensor voltage, of the capacitive sensor 10 into a sensor current. An output side of the GM stage 2 is coupled to an integrator 3. An output side of the integrator 3 is coupled to an input side of a hold circuit 4. The integrator 3 integrates over a time course of a charge state of a capacitance that is charged by the sensor current of the GM stage 2. The resulting output voltage of the integrator 3 is sampled by the hold circuit 4, held and provided as a hold voltage at an output side of the hold circuit 4.

The hold voltage is provided to the capacitive sensor 10 as feedback voltage. An analog-to-digital converter 5, such as a sigma-delta converter, is coupled to the output side of the hold circuit 4. The hold voltage is provided to the analog-to-digital converter 5 as an input voltage to be converted. According to further embodiments, the analog-to-digital converter 5 can be directly coupled to the integrator 3.

The hold circuit 4 holds the output signal so that the capacitance can be reset and at the same time a charge state of the capacitances of the capacitive sensor 10 can be maintained. The sensor apparatus 100 is thus a charge balance sensor that ensures a charge balance of the capacitive sensor 10. According to further embodiments, an architecture without a charge balance is also possible.

The circuit provides the hold voltage to the capacitive sensor 10 as feedback voltage in a first time interval Φ1 (i.e. a first mode) and in a subsequent second time interval Φ2 (i.e. a second mode). Furthermore, in the first time interval Φ1, an offset correction is performed in the GM stage 2 and the integrator 3.

In the second time interval Φ2, an output terminal of the capacitive sensor 10 is high impedance, so that an EMI-induced DC error couples in. This can be achieved by electrically coupling the output terminal of the capacitive sensor only via capacitances.

In a third time interval Φ3 (a third mode) following the second time interval, a voltage at the output terminal of the capacitive sensor 10 is processed by the GM stage 2, the integrator 3 and the hold circuit and provided to the analog-to-digital converter 5 as an input voltage to be converted. A reference voltage is provided to the capacitive sensor 10 in the third time interval Φ3.

Figure 2A:
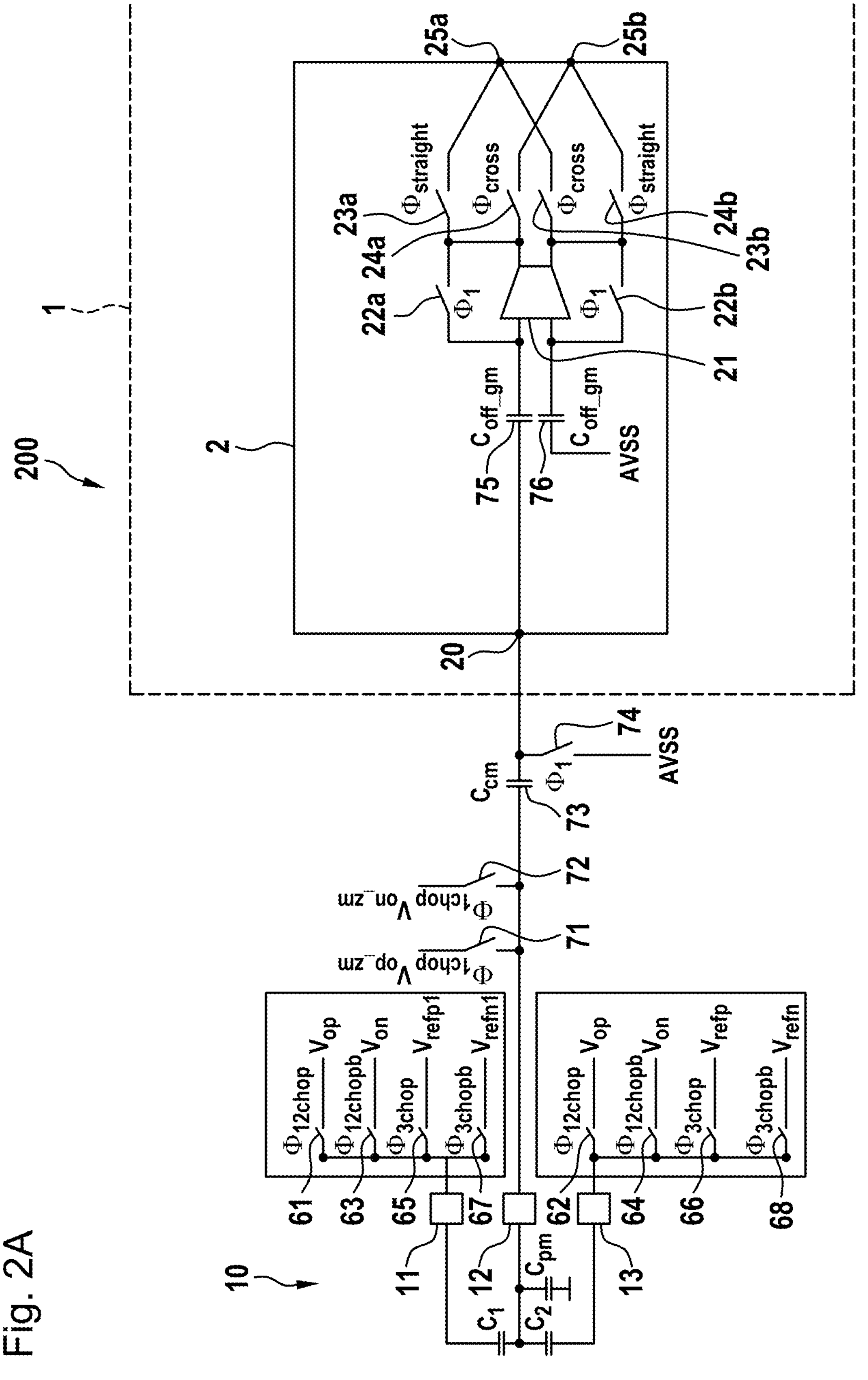
FIGS. 2A and 2B together show a block diagram of a sensor apparatus according to a further embodiment of the present invention.
Figure 2B:
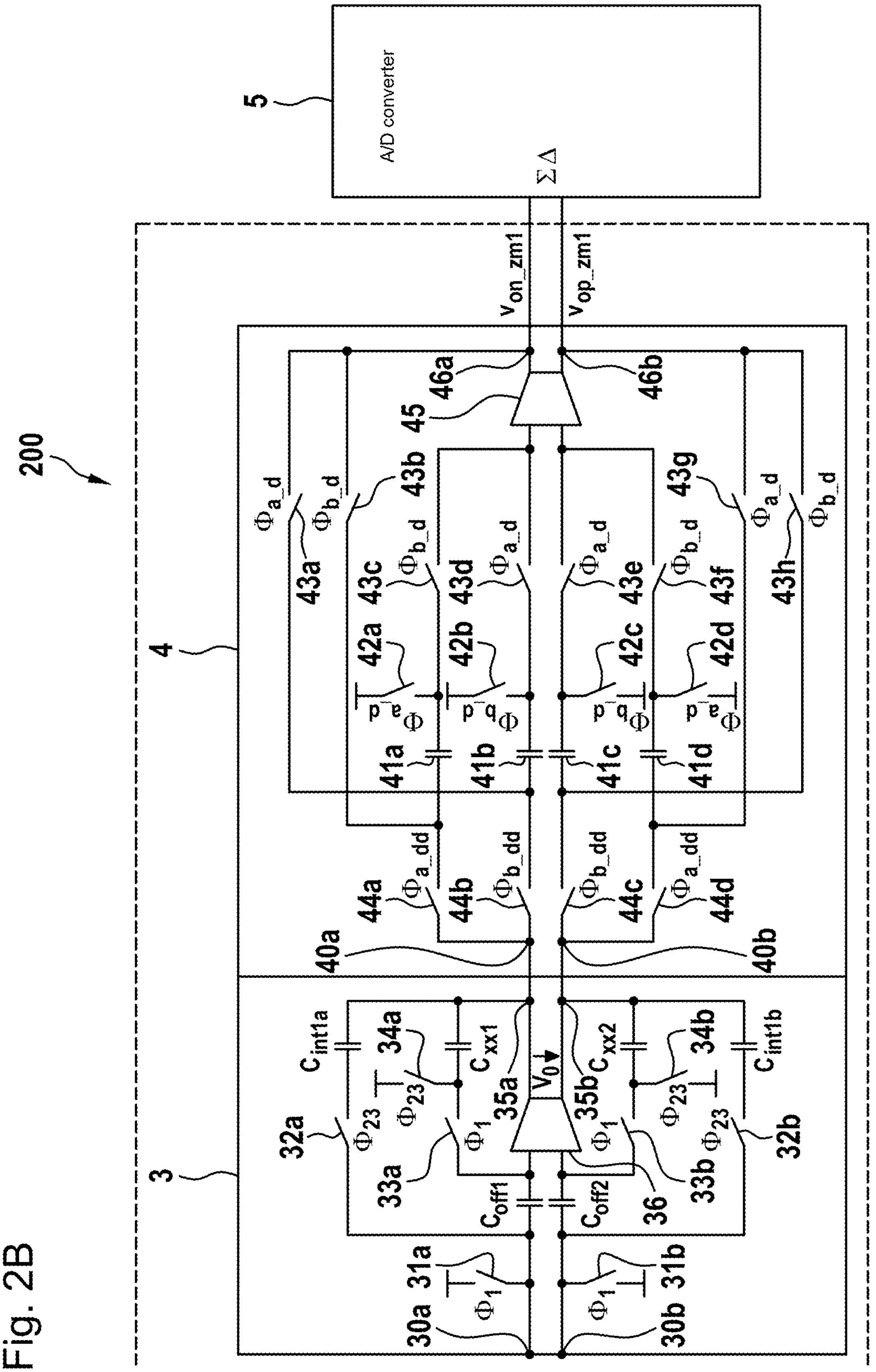

FIGS. 2A and 2B together show a circuit diagram of a sensor apparatus 200. A capacitive sensor 10 has a first capacitance C1 and a second capacitance C2. The first capacitance and the second capacitance C1, C2 can each be a capacitor formed from a flywheel and a further electrode of the capacitive sensor 10.

The first capacitance C1 and the second capacitance C2 are connected to form a bridge by coupling a contact of the first capacitance C1 to a contact of the second capacitance C2, whereby this common contact has a common potential, wherein the common contact is simultaneously a sensor output 12 of the capacitive sensor 10 at which a sensor voltage of the capacitive sensor 10 is provided.

The contacts of the first capacitance C1 and the second capacitance C2, which are not connected to each other, form two input terminals 11, 13 of the capacitive sensor 10. A first sensor input 11 is coupled to the sensor output 12 via the first capacitance C1 and a second sensor input 13 is coupled to the sensor output 12 via the second capacitance C2. An optional ground capacitance Cpm connects the common potential, i.e. the sensor output 12, to a circuit ground of the sensor apparatus 200. The ground capacitance Cpm can be a parasitic capacitance.

The sensor inputs 11, 13 of the capacitive sensor 10 are coupled to outputs 46*a*, 46*b* of a hold circuit 4 in order to be supplied with a hold voltage Von_zm1, Vop_zm1, which is held by the hold circuit 4 at the outputs 46*a*, 46*b*. This is done via a plurality of feedback switches 61 to 68, which allow different voltages to be applied to the first sensor input 11 and the second sensor input 13.

The first sensor input 11 is coupled to a first side of a first feedback switch 61, a third feedback switch 63, a fifth feedback switch 65 and a seventh feedback switch 67. The second sensor input 13 is coupled to a second side of a second feedback switch 62, a fourth feedback switch 64, a sixth feedback switch 66 and an eighth feedback switch 68. The second side of the feedback switches 61 to 68 is in each case coupled via a feedback path (not shown) to the output 46*a*, 46*b* of the hold circuit 4 and/or a voltage source generating a reference voltage.

The sensor output 12 is connected to an input contact 20 of the GM stage 2 via a common mode capacitance 73 with capacitance value Ccm and to a circuit ground AVSS via a switching element 74. Furthermore, the sensor output 12 is connected to a first input potential switch 71 and a second input potential switch 72, by means of which the sensor output 12 can be coupled to an output of the hold circuit 4. For this purpose, the sensor output 12 is coupled to the output of the hold circuit 4 via a feedback path (not shown).

The input contact 20 is coupled to a first input of a first amplifier 21 via a first ground capacitance 75 with capacitance value Coff_gm.

A second input of the first amplifier 21 is coupled to the circuit ground AVSS via a second ground capacitance 76 with capacitance value Coff_gm.

The GM stage 2, the integrator 3 and the hold circuit 4 are differential circuits with a differential, i.e. split signal path, which are referred to below as the first differential signal path and the second differential signal path. The first differential signal path and the second differential signal path are constructed symmetrically to each other in the GM stage 2, the integrator 3 and the hold circuit 4, i.e. they have the same components in the same circuit.

The first amplifier 21 is a differential transconductance amplifier. A first input of the first amplifier 21 is connected to the input contact 20 or forms this input contact 20.

If a sensor voltage is provided by the capacitive sensor 10 via its sensor output 12, said sensor voltage is applied to the input contact 20 of the GM stage 2 and is converted into a sensor current by the first amplifier 21.

The circuit 1 for operating the capacitive sensor 10 is configured to be operated alternately over a first time interval Φ1 in a first mode, over a second time interval Φ2 in a second mode and over a third time interval Φ3 in a third mode. The circuit 1 is operated exclusively in either the first mode, the second mode or the third mode. This means that at any given time either the first time interval Φ1, the second time interval Φ2 or the third time interval Φ3 is present. The first mode, the second mode and the third mode differ in that a plurality of switching elements in the sensor apparatus 100 are brought into a corresponding switching state. This is illustrated in FIGS. 2A and 2B in such a way that the switching elements marked as Φ1 are brought to a closed state in the first time interval Φ1. In a corresponding manner, the switching elements, which are designated as Φ2 and Φ3 elements, are brought to a closed state in the second time interval Φ2 and the third time interval Φ3, respectively.

Furthermore, the circuit 1 is operated alternately in a first chopping time interval chop and a second chopping time interval chopb. Both the first chopping time interval chop and the second chopping time interval chopb are divided into a first time interval Φ1, a second time interval Φ2 and a third time interval Φ3. Thus, the first chopping time interval chop consists of a first time interval Φ1, a second time interval Φ2 and a third time interval Φ3. Similarly, the second chopping time interval chopb is composed of a first time interval Φ1, a second time interval Φ2 and a third time interval Φ3.

This means that in the representation shown in FIGS. 2A and 2B, the switching elements that are marked with the index "chop" in the respectively displayed first, second or third time interval Φ1, Φ2, Φ3 are switched to a closed state only during the first chopping time interval chop. In a corresponding manner, this also means that the switching elements that are marked with the index "chopb" in the respectively displayed first, second or third time interval Φ1, Φ2, Φ3 are switched to a closed state only during the second chopping time interval chopb. If neither an index chop nor chopb is shown, the particular switching element is switched to a closed state regardless of the current chopping time interval.

The following designations are also used:

$$\Phi\_ij = (\Phi\_i \mid \Phi\_j)$$

$$\Phi\_ijchop = (\Phi\_i \mid \Phi\_j) \,\&\, \Phi\_chop,$$

-continued $$\Phi\_ijchopb = (\Phi\_i \mid \Phi\_j) \,\&\, \Phi\_chopb,$$

$$\Phi\_straight = (\Phi\_2 \,\&\, \Phi\_chopb) \mid (\Phi\_3 \,\&\, \Phi\_chop)$$

$$\Phi\_cross = (\Phi\_2 \,\&\, \Phi\_chop) \mid (\Phi\_3 \,\&\, \Phi\_chopb)$$

where i and j each denote one of 1, 2 or 3, and the symbols "|" and "&" stand for "or" and "and", respectively.

A first input of the first amplifier 21 is coupled on the one hand to a first output of the first amplifier 21 via a first GM switching element 22*a* and on the other hand to a first output 25*a* of the GM stage 2 or second output 25*b* of the GM stage 2 via a second GM switching element 23*a* or third GM switching element 24*a*.

A second input of the first amplifier 21 is coupled on the one hand to a second output of the first amplifier 21 via a fourth GM switching element 22*b* and on the other hand to the first output 25*a* of the GM stage 2 or the second output 25*b* of the GM stage 2 via a fifth GM switching element 23*b* or sixth GM switching element 24*b*.

During the switching time Φ_straight defined above, the second GM switching element 23*a* and the sixth GM switching element 24*b* are closed, and during the switching time Φ_cross defined above, the third GM switching element 24*a* and the fifth GM switching element 23*b* are closed.

The switching elements 23*a*, 23*b*, 24*a*, 24*b* are closed in such a way that the output signal of the GM stage 2 is integrated with opposite signs in Φ2 and Φ3.

The first output 25*a* of the GM stage 2 is connected to a first integrator input 30*a* of the integrator 3. The second output 25*b* of the GM stage 2 is connected to a second integrator input 30*b* of the integrator 3. A particular voltage is integrated via the integrator inputs 30*a*, 30*b* over its time course. This occurs in the third time interval Φ3. A resulting output voltage Vo is provided at an output 35*a*, 35*b* of the integrator 3, which comprises a first output contact 35*a* and a second output contact 35*b*.

The integrator 3 comprises a second amplifier 36, which is also a transconductance amplifier. The second amplifier 36, like the first amplifier 21, is a differential amplifier.

A first input of the second amplifier 36 is connected to the first integrator input 30*a* via a first offset capacitance Coff1 of the integrator 3. A first output of the second amplifier 36 is connected to the first output contact 35*a* of the integrator 3. A second input of the second amplifier 36 is connected to the second integrator input 30*b* via a second offset capacitance Coff2 of the integrator 3. A second output of the second amplifier 36 is connected to the second output contact 35*b* of the integrator 3.

The first integrator input 30*a* and the first output contact 35*a* of the integrator 3 are connected via a current path in which a first switching element 32*a* of the integrator and an integrator capacitance Cint1*a* are arranged. During the second time interval Φ2 and the third time interval Φ3, a charge is integrated in the first integrator capacitance Cint1*a*, which charge results from the charge present at the first integrator input 30*a*.

Furthermore, the first input of the second amplifier 36 is connected to the first output contact 35*a* of the integrator 3 via a second current path in which a second switching element 33*a* of the integrator and a first further capacitance Cxx1 are arranged. Said second current path is activated in the first time interval Φ1 by closing the second switching element 33*a* of the integrator 3.

The second integrator input 30*b* and the second output contact 35*b* of the integrator 3 are connected via a current path in which a further first switching element 32$b$ of the integrator 3 and a further integrator capacitance Cint1$b$ are arranged. During the second time interval Φ2 and the third time interval Φ3, a charge is integrated in the further first integrator capacitance Cint1$b$, which charge results from the charge present at the second integrator input 30$b$. Furthermore, the second input of the second amplifier 36 is connected to the second output contact 35$b$ of the integrator 3 via a second current path in which a further second switching element 33$b$ of the integrator 3 and a second further capacitance Cxx2 are arranged. Said second current path is activated in the first time interval Φ1 by closing the further second switching element 33$b$ of the integrator 3.

The current paths between the inputs and the outputs of the second amplifier 36 with the integrator capacitances Cint1$a$, Cint1$b$ and the further capacitances Cxx1, Cxx2 make it possible to obtain an integrated value to be obtained in the integrator 3 even during the first time interval 1 and to carry out an integration process over a plurality of consecutive second time intervals Φ2 and third time intervals Φ3.

Furthermore, the integrator 3 comprises a first ground switch 31$a$ and a second ground switch 34$a$ in the first differential current path. The first ground switch 31$a$ is configured to couple the first integrator input 30$a$ to the circuit ground in the first time interval Φ1. The second ground switch 34$a$ is configured to couple an input-side potential of the first further capacitance Cxx1 to the circuit ground. Furthermore, the integrator 3 comprises a third ground switch 31$b$ and a fourth ground switch 34$b$ in the second differential current path. The third ground switch 31$b$ is configured to couple the second integrator input 30$b$ to the circuit ground in the first time interval Φ1. The fourth ground switch 34$b$ is configured to couple an input-side potential of the second further capacitance Cxx2 to the circuit ground.

The integrator 3 is thus configured to integrate a voltage over its time course in the second time interval Φ2 and the third time interval Φ3 and to output a resulting output voltage Vo at the output 35$a$, 35$b$ of the integrator 3.

A first input contact 40$a$ of the hold circuit 4 is connected to the first output contact 35$a$ of the integrator 3. A second input contact 40$b$ of the hold circuit 4 is connected to the second output contact 35$b$ of the integrator 3.

The hold circuit 4 comprises a third amplifier 45, which is a differential transconductance amplifier. A first output of the third amplifier 45 is coupled to a first output contact 46$a$ of the hold circuit 4. A second output of the third amplifier 45 is coupled to a second output contact 46$b$ of the hold circuit 4.

The first output contact 35$a$ of the integrator 3 is coupled to a first input of the third amplifier 45 or to the ground potential via a first hold switching element 44$a$, a first capacitor 41$a$ and a second hold switching element 43$c$ or a third hold switching element 42$a$. The first output contact 35$a$ of the integrator 3 is further coupled to the first output contact 46$a$ of the hold circuit 4 via the first hold switching element 44$a$ and a fourth hold switching element 43$b$.

The first output contact 35$a$ of the integrator 3 is coupled to the first input of the third amplifier 45 or to the ground potential via a fifth hold switching element 44$b$, a second capacitor 41$b$ and a sixth hold switching element 43$d$ or a seventh hold switching element 42$b$. The first output contact 35$a$ of the integrator 3 is further coupled to the first output contact 46$a$ of the hold circuit 4 via the fifth hold switching element 44$b$ and an eighth hold switching element 43$a$.

The second output contact 35$b$ of the integrator 3 is coupled to a second input of the third amplifier 45 or to the ground potential via a ninth hold switching element 44$c$, a third capacitor 41$c$ and a tenth hold switching element 43$e$ or an eleventh hold switching element 42$c$. The second output contact 35$b$ of the integrator 3 is further coupled to the second output contact 46$b$ of the hold circuit 4 via the ninth hold switching element 44$c$ and a twelfth hold switching element 43$h$.

The second output contact 35$b$ of the integrator 3 is coupled to the second input of the third amplifier 45 or the ground potential via a thirteenth hold switching element 44$d$, a fourth capacitor 41$d$ and a fourteenth hold switching element 43$f$ or a fifteenth hold switching element 42$d$. The second output contact 35$b$ of the integrator 3 is further coupled to the second output contact 46$b$ of the hold circuit 4 via the thirteenth hold switching element 44$d$ and a sixteenth hold switching element 43$g$.

The mode of operation of the circuit 1 is as follows: An input side of the circuit 1 shown is formed by a capacitive sensor 10, for example by a single core of a capacitive MEMS sensor. In a signal processing chain, the capacitive sensor 10 is followed first by the GM stage 2, then the integrator 3 and finally the optional hold circuit 4. In this case, the capacitive sensor 10 corresponds to a capacitive bridge. A delta C/C concept is implemented, wherein two voltages of equal magnitude and reversed polarity are applied to the two sides of the capacitive bridge. An output signal of the capacitive sensor 10 results in a proportional manner from the variable capacitances C1, C2 of the capacitive sensor 10

This output signal, which is provided at the sensor output 12, is proportional to an acceleration at a common-mode electrode and thus at the sensor output 12. The signal emitted by the capacitive sensor 10 is sampled by the GM stage 2 with a sampling time T. An outgoing signal is integrated by the integrator 3, wherein amplification occurs that results from the transconductance of the GM stage, the integration time and the integration capacitance.

The output voltage of the integrator 3 is passed to the hold circuit 4, which subsequently provides it as a hold voltage to the capacitive sensor 10 and the analog-to-digital converter 5. In this case, the hold circuit 4 provides the hold voltage to the capacitive sensor 10 as feedback voltage in the first time interval Φ1 and in the second time interval Φ2.

A new output value of the integrator 3 is tapped in the following first to third time intervals Φ1 to Φ3. This hold voltage at the end of the third time interval Φ3 is fed back to the capacitive sensor 10 during the first and second time intervals Φ1, Φ2 and is further provided at the input of the GM stage 2. Thus, a voltage difference of the capacitive sensor 10 can be set, wherein, depending on an existing chopping time interval, the capacitive sensor 10 is subjected to half the hold voltage or half the hold voltage Von_zm1, Von_zm1 is subtracted from the existing voltage.

The hold switching elements 42$a$ to 44$d$ are switched on and off in phases Φ_a and Φ_b as shown in FIGS. 2A and 2B. Φ_a and Φ_b change their value after three phases Φ_1 to Φ_3 and are opposite.

The feedback V_op, V on provided by the hold circuit 4 during the first time interval Φ1 is also applied to the sensor 10 during the second time interval Φ2. The bias voltage V_refp, V_refn of the reference voltage is applied only during the third time interval Φ3.

The EMI-induced DC error couples in during the second time interval Φ2 and remains during the third time interval Φ3. Therefore, this error is integrated positively during the second time interval Φ2 and negatively during the second time interval Φ3. For complete cancellation, the second and third time intervals Φ2, Φ3 preferably have the same length. An error caused by a remaining time difference between the second time interval Φ2 and the third time interval Φ3 can be reduced by random chopping, because Φ_straight and Φ_cross also depend on the phase of Φ_chop and the error is therefore spread over the entire spectrum.

An EMI-induced DC error is thus integrated positively during the second time interval Φ2 and negatively during the third time interval Φ3, so that the error is effectively canceled.

The hold voltage Von_zm, Vop_zm and thus also a value of the resulting output voltage Vo of the integrator 3 is further transmitted to an analog-to-digital converter 5, which digitizes this hold voltage and converts it into a bit stream. At the output of the hold circuit 4, the output voltage is equivalent to a value (ΔC/ΣC) multiplied by the positive reference voltage Vs. The integrator 3 and an integrator of the analog-to-digital converter 5, in particular if the latter is designed as a sigma-delta modulator, perform an offset correction.

What is claimed is:

1. A circuit for operating a capacitive sensor, which is configured to be operated alternately over a first time interval in a first mode, over a second time interval in a second mode, and over a third time interval in a third mode, the circuit comprising:
- a GM stage configured to receive a sensor voltage applied to a sensor output of the capacitive sensor and to output a current; and
- an integrator configured to integrate the output current over a time course and to output an output voltage resulting therefrom;
- wherein the circuit is configured to provide the output voltage to an analog-to-digital converter;
- wherein the circuit is configured to provide the output voltage to the capacitive sensor as a feedback voltage in the first mode and in the second mode;
- wherein the circuit is configured to perform, in the first mode, an offset correction in the GM stage and the integrator;
- wherein the circuit is configured to switch the sensor output of the capacitive sensor to high impedance in the second mode; and
- wherein the circuit is configured to provide a reference voltage to the capacitive sensor in the third mode.

2. The circuit according to claim 1, wherein the second time interval and the third time interval (Φ3) have the same length.

3. The circuit according to claim 1, wherein the integrator is configured to integrate an EMI-induced DC error during the second time interval and during the third time interval with opposite signs.

4. The circuit according to claim 1, wherein the integrator is configured to integrate over a time course of a charge state of at least one capacitance of the integrator, the capacitance being charged by a sensor current of the GM stage.

5. The circuit according to claim 1, further comprising:
- a hold circuit configured to tap the output voltage of the integrator and to hold the output voltage at an output of the hold circuit as a hold voltage and to provide it to the analog-to-digital converter and the capacitive sensor.

6. The circuit according to claim 5, wherein the hold circuit is coupled to the capacitive sensor via a plurality of feedback switches.

7. The circuit according to claim 5, wherein the GM stage, the integrator, and the hold circuit are differential circuits.

8. The circuit according to claim 1, wherein the sensor output of the capacitive sensor is coupled to the GM stage via a common mode capacitance.

9. The circuit according to claim 1, wherein the integrator is configured to integrate the output current continuously over time during one of the first, second, and third time intervals and to integrate the output current discretely between two cycles of time intervals.

10. A sensor apparatus, comprising:
- a capacitive sensor which is configured to be operated alternately over a first time interval in a first mode, over a second time interval in a second mode, and over a third time interval in a third mode; and
- a circuit configured to operate the capacitive sensor, the circuit including:
  - a GM stage configured to receive a sensor voltage applied to a sensor output of the capacitive sensor and to output a current, and
  - an integrator configured to integrate the output current over a time course and to output an output voltage resulting therefrom,
  - wherein the circuit is configured to provide the output voltage to an analog-to-digital converter,
  - wherein the circuit is configured to provide the output voltage to the capacitive sensor as a feedback voltage in the first mode and in the second mode,
  - wherein the circuit is configured to perform, in the first mode, an offset correction in the GM stage and the integrator,
  - wherein the circuit is configured to switch the sensor output of the capacitive sensor to high impedance in the second mode, and
  - wherein the circuit is configured to provide a reference voltage to the capacitive sensor in the third mode.

11. The sensor apparatus according to claim 10, wherein the sensor output of the capacitive sensor is a common mode electrode of the capacitive sensor.

12. The sensor apparatus according to claim 10, wherein the capacitive sensor is a MEMS sensor, the MEMS sensor being an acceleration sensor or a gyroscope.

* * * * *